United States Patent
Liu et al.

(10) Patent No.: US 9,385,069 B2
(45) Date of Patent: Jul. 5, 2016

(54) GATE CONTACT STRUCTURE FOR FINFET

(71) Applicant: Taiwan Semiconductor Manufacturing Company, Ltd., Hsin-Chu (TW)

(72) Inventors: Chi-Wen Liu, Hsin-Chu (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 32 days.

(21) Appl. No.: 13/789,145

(22) Filed: Mar. 7, 2013

(65) Prior Publication Data

US 2014/0252496 A1 Sep. 11, 2014

(51) Int. Cl.
| | |
|---|---|
| *H01L 27/088* | (2006.01) |
| *H01L 23/482* | (2006.01) |
| *H01L 21/3213* | (2006.01) |
| *H01L 21/28* | (2006.01) |
| *H01L 21/285* | (2006.01) |
| *H01L 21/74* | (2006.01) |
| *H01L 21/768* | (2006.01) |

(Continued)

(52) U.S. Cl.
CPC ............ *H01L 23/4827* (2013.01); *H01L 21/28* (2013.01); *H01L 21/28114* (2013.01); *H01L 21/28587* (2013.01); *H01L 21/3213* (2013.01); *H01L 21/32133* (2013.01); *H01L 21/32134* (2013.01); *H01L 21/32135* (2013.01); *H01L 21/32136* (2013.01); *H01L 21/743* (2013.01); *H01L 21/76843* (2013.01); *H01L 21/76886* (2013.01); *H01L 21/76897* (2013.01); *H01L 21/823475* (2013.01); *H01L 21/823871* (2013.01); *H01L 29/40* (2013.01); *H01L 29/41* (2013.01); *H01L 29/66795* (2013.01); *H01L 29/785* (2013.01); *H01L 2027/11866* (2013.01); *H01L 2029/7858* (2013.01); *H01L 2924/0002* (2013.01); *H01L 2924/13067* (2013.01)

(58) Field of Classification Search
CPC ... H01L 29/78; H01L 29/7831; H01L 29/785; H01L 21/28; H01L 21/3213; H01L 21/32133; H01L 21/32134; H01L 21/32135; H01L 21/32136; H01L 21/28114; H01L 21/28587; H01L 2924/13067; H01L 21/743; H01L 21/76886; H01L 21/76897; H01L 21/823475; H01L 21/823871; H01L 2027/11866; H01L 29/40; H01L 29/41; H01L 2029/40; H01L 2029/41; H01L 2029/423; H01L 2029/42312; H01L 2029/42316; H01L 2029/4232
See application file for complete search history.

(56) References Cited

U.S. PATENT DOCUMENTS

| 7,510,975 B2 * | 3/2009 | Kishimoto et al. ........... 438/706 |
| 2003/0194867 A1 * | 10/2003 | Kudelka et al. .............. 438/689 |

(Continued)

FOREIGN PATENT DOCUMENTS

| KR | 1020050104077 | * | 2/2005 |
| KR | 100585178 | | 5/2006 |

OTHER PUBLICATIONS

Ju Youn Kim et al, "Comparison of TiN and TiAlN as a Diffusion Barrier Deposited by Atomic Layer Deposition", Jan. 2002, Journal of the Korean Physical Society, vol. 40, No. 1, pp. 176-179.*

*Primary Examiner* — Fei Fei Yeung Lopez
(74) *Attorney, Agent, or Firm* — Slater Matsil, LLP

(57) ABSTRACT

An embodiment includes a substrate, wherein a portion of the substrate extends upwards forming a fin, a gate dielectric over a top surface and at least portions of sidewalls of the fin, a gate electrode over the gate dielectric, and a contact over and extending into the gate electrode, wherein the contact has a first width above the gate electrode and a second width within the gate electrode, the first width being smaller than the second width.

20 Claims, 6 Drawing Sheets

(51) Int. Cl.
   *H01L 21/8234* (2006.01)
   *H01L 21/8238* (2006.01)
   *H01L 29/40* (2006.01)
   *H01L 29/41* (2006.01)
   *H01L 29/66* (2006.01)
   *H01L 27/118* (2006.01)
   *H01L 29/78* (2006.01)

(56) References Cited

U.S. PATENT DOCUMENTS

| | | | |
|---|---|---|---|
| 2005/0221601 A1* | 10/2005 | Kawano | 438/622 |
| 2005/0277258 A1* | 12/2005 | Huang et al. | 438/300 |
| 2006/0157749 A1* | 7/2006 | Okuno | 257/288 |
| 2006/0175669 A1 | 8/2006 | Kim et al. | |
| 2007/0099414 A1* | 5/2007 | Frohberg et al. | 438/618 |
| 2007/0158700 A1* | 7/2007 | Koh et al. | 257/288 |
| 2010/0118599 A1 | 5/2010 | Marshall et al. | |
| 2010/0133615 A1* | 6/2010 | Mulfinger et al. | 257/347 |
| 2012/0032732 A1 | 2/2012 | Xiao et al. | |
| 2012/0074386 A1 | 3/2012 | Rachmady et al. | |
| 2013/0049109 A1 | 2/2013 | Lim et al. | |
| 2013/0069174 A1* | 3/2013 | Chuang et al. | 257/410 |
| 2013/0187228 A1* | 7/2013 | Xie et al. | 257/347 |
| 2013/0224945 A1* | 8/2013 | Liu et al. | 438/595 |
| 2013/0256802 A1* | 10/2013 | Jagannathan et al. | 257/368 |

* cited by examiner

GATE CONTACT STRUCTURE FOR FINFET

BACKGROUND

With the increasing down-scaling of integrated circuits (IC) and increasingly demanding requirements to the speed of ICs, transistors need to have higher drive currents with increasingly smaller dimensions. Fin field-effect transistors (FinFET) were thus developed. In a typical finFET, portions of a substrate are etched away to create a vertical fin structure. This vertical fin structure is used to form source/drain regions in the lateral direction, forming a channel region in the fin. A gate is formed over channel region of the fin in the vertical direction forming a finFET. Subsequently, an inter-layer dielectric (ILD) and a plurality of interconnect layers may be formed over the finFET. The ILD includes gate contacts electrically connecting the gate to other active components in the IC through the plurality of interconnect layers.

The gate contacts are generally narrower in width than the gate; therefore, the gate contact area may be relatively small. A small gate contact area creates high contact resistance between the gate and the gate contact. Unfortunately, due to design rule limitations, the width of the gate contact is not easily increased or adjusted.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments of integrated circuits (IC) structure will be described with respect to a specific context, namely a fin field-effect transistor (finFET). Other transistor structures (such as Tunnel field-effect transistor or nano-wire field-effect transistor) and analogous structures are within the contemplated scope of the disclosure. The finFET may be included in a microprocessor, memory cell, and/or other integrated circuit (IC).

FIGS. 1-9 illustrate cross-sectional views of various stages of manufacture of an integrated circuits (IC) structure 100 in accordance with various embodiments, wherein the cross-sectional view is made crossing a fin rather than any source/drain regions. As employed in the present disclosure, the term integrated circuits (IC) structure 100 refers to a fin field effect transistor (finFET) 100. The finFET 100 refers to any fin-based, multi-gate transistor. The finFET 100 includes a gate formed over a vertical fin. A top portion of the gate is isotropically etched to create an expanded contact area between a gate contact and the gate without increasing the width of the gate contact. In this manner, contact resistance between the gate contact and the gate may be reduced without violating design rules. In various embodiments, the ratio of a width of the expanded contact area to a width of the fin is between about 1.2 and 2.5.

Figure 1:
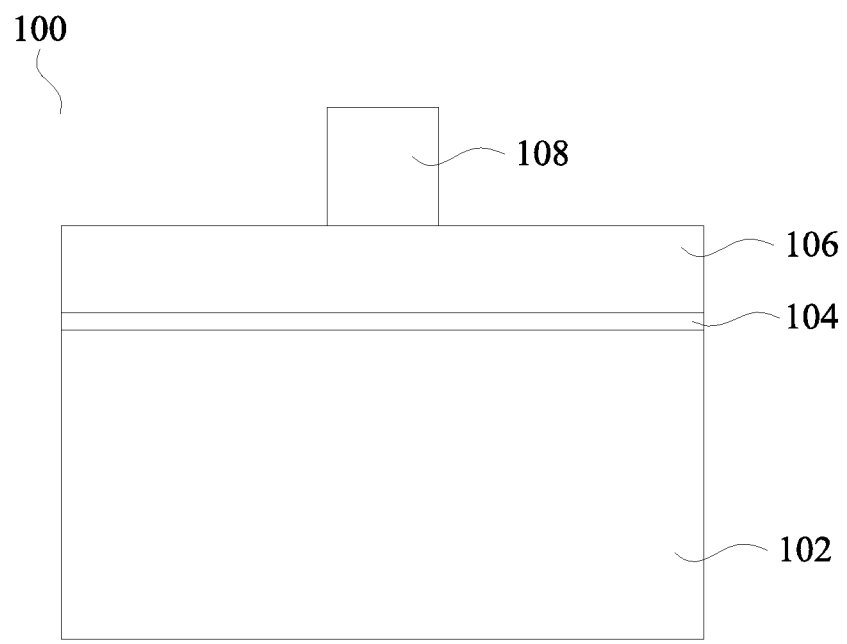
FIGS. 1-9 are cross-sectional views of intermediate stages of manufacture of an integrated circuits (IC) structure in accordance with various embodiments.

FIG. 1 illustrates a cross-sectional view of a finFET 100, which includes substrate 102. Substrate 102 may be a bulk substrate or a semiconductor-on-insulator (SOI) substrate. Substrate 102 may be formed of silicon or silicon germanium, although other semiconductor materials including group III, group IV, and group V elements may also be used.

Buffer layer 104 and mask 106 may be formed on substrate 102. Buffer layer 104 may be formed of silicon oxide using, for example, a thermal oxidation process. Buffer layer 104 may act as an adhesion layer and reduces strain between substrate 102 and mask 106. Buffer layer 104 may further act as an etch stop layer for etching mask 106. Mask 106 may be formed of silicon nitride using, for example, low-pressure chemical vapor deposition (LPCVD), thermal nitridation of silicon, plasma enhanced chemical vapor deposition (PECVD), or plasma anodic nitration. Mask 106 is used as a hard mask during subsequent photolithography processes. Photo resist layer 108 is formed and patterned over mask 106, exposing portions of the underlying mask 106.

Figure 2:
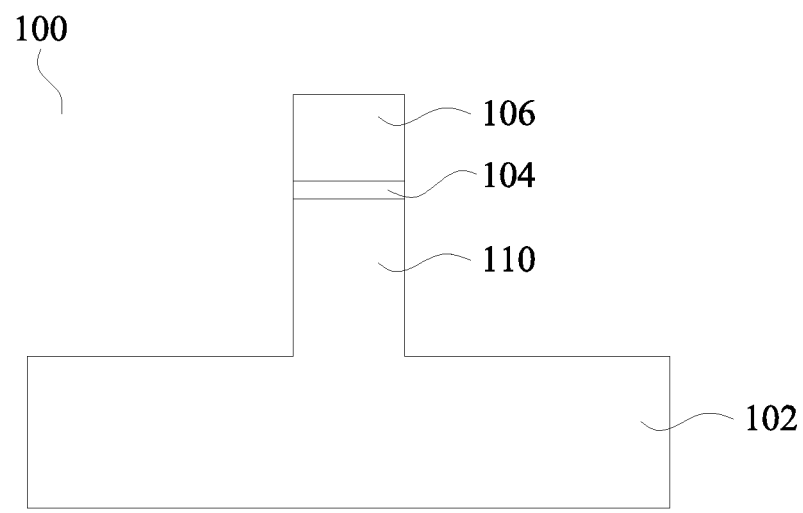

Referring now to FIG. 2, mask 106 and buffer layer 104 are etched through the openings in photo resist layer 108. Substrate 102 is then etched, forming a fin 110. Although only one fin 110 is shown in FIG. 2, alternate embodiments include forming multiple fins in the same process step (e.g., to form a multi-fin finFET or to simultaneously form multiple finFETs). Photo resist layer 108 is subsequently removed. Alternatively, fins may also be formed by depositing an oxide layer (e.g., silicon oxide) over substrate 102, patterning the oxide layer, and epitaxially growing fins.

Figure 3:
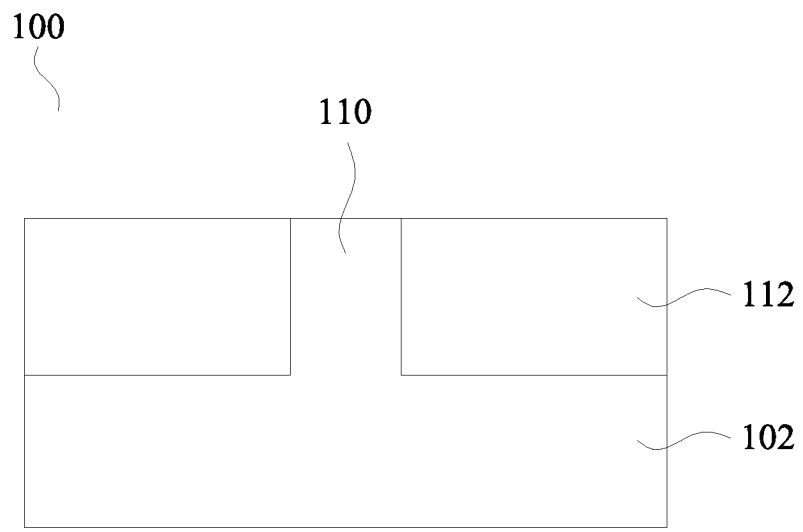

In FIG. 3, dielectric layer 112 is deposited over substrate 102. Dielectric layer 112 may be formed of silicon oxide, although other dielectric materials such as SiN, SiC, or the like may also be used. Dielectric layer 112 may be blanket deposited over substrate 102. In various embodiments including multiple fins, dielectric layer 112 may serve as an isolation layer to isolate individual fins. A chemical-mechanical polish (CMP) may be performed on dielectric layer 112 to expose the top portion of fin 110, so that the top surface of dielectric layer 112 is level with the top surface of fin 110.

Figure 4:
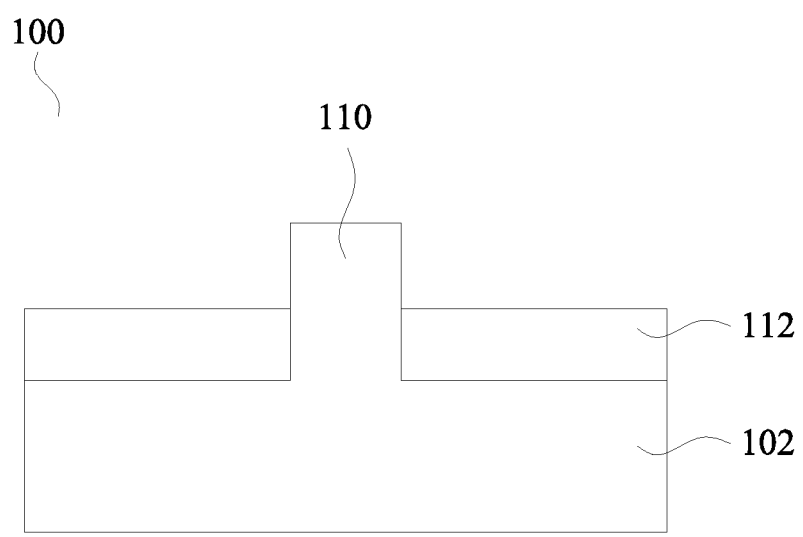

FIG. 4 illustrates the recessing of dielectric layer 112, for example, by etching. As a result of the recessing, a portion of fin 110 is exposed and extends above the top surface of dielectric layer 112. When finFET 100 is fully formed, this portion of fin 110 extending over the top surface of dielectric layer 112 acts as a channel region.

Figure 5:
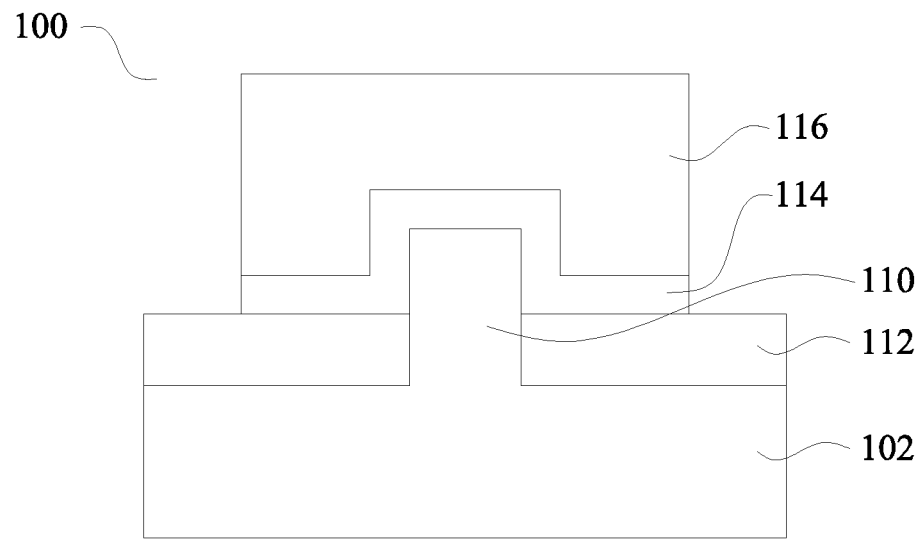

FIG. 5 illustrates the formation of a gate dielectric 114 and gate electrode 116 over fin 110. Gate electrode 116 may include a work function metal and a signal metal. For ease of illustration, the layers of gate electrode 116 are not individually shown. The gate dielectric may include silicon dioxide, silicon nitride, or a high-k dielectric material having a k value greater than about 7.0. The high-k dielectric material may comprise metal oxides. Examples of metal oxides used for high-k dielectric material include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, gate dielectric 114 has a thickness in the range of about 5 Å to about 30 Å. The gate dielectric 114 may be formed on the top surface and sidewalls of fin 110 through a thermal oxidation method, or it may be blanket deposited over fin 110 through a chemical vapor deposition (CVD) process, an atomic layer deposition (ALD) process. The work function metal may then be formed over the gate dielectric, of aluminum, titanium aluminum, tungsten, titanium nitride, tantalum nitride, tantalum carbide, or the like. The work function metal induces a charge in the channel region (i.e., the fin) when an appropriate bias voltage is applied after finFET 100 is fully formed. Generally, the contact resistance of the work function metal may be relatively high. Therefore, a lower-resistance signal metal is formed over the work function metal to reduce the overall contact resistance the device. The signal metal may be formed of aluminum, aluminum copper, and the like, although other metallic materials may also be used. Gate electrode 116 (i.e., work function metal and signal metal) may be formed by CVD, plating, ALD, or other suitable technique.

Figure 10:
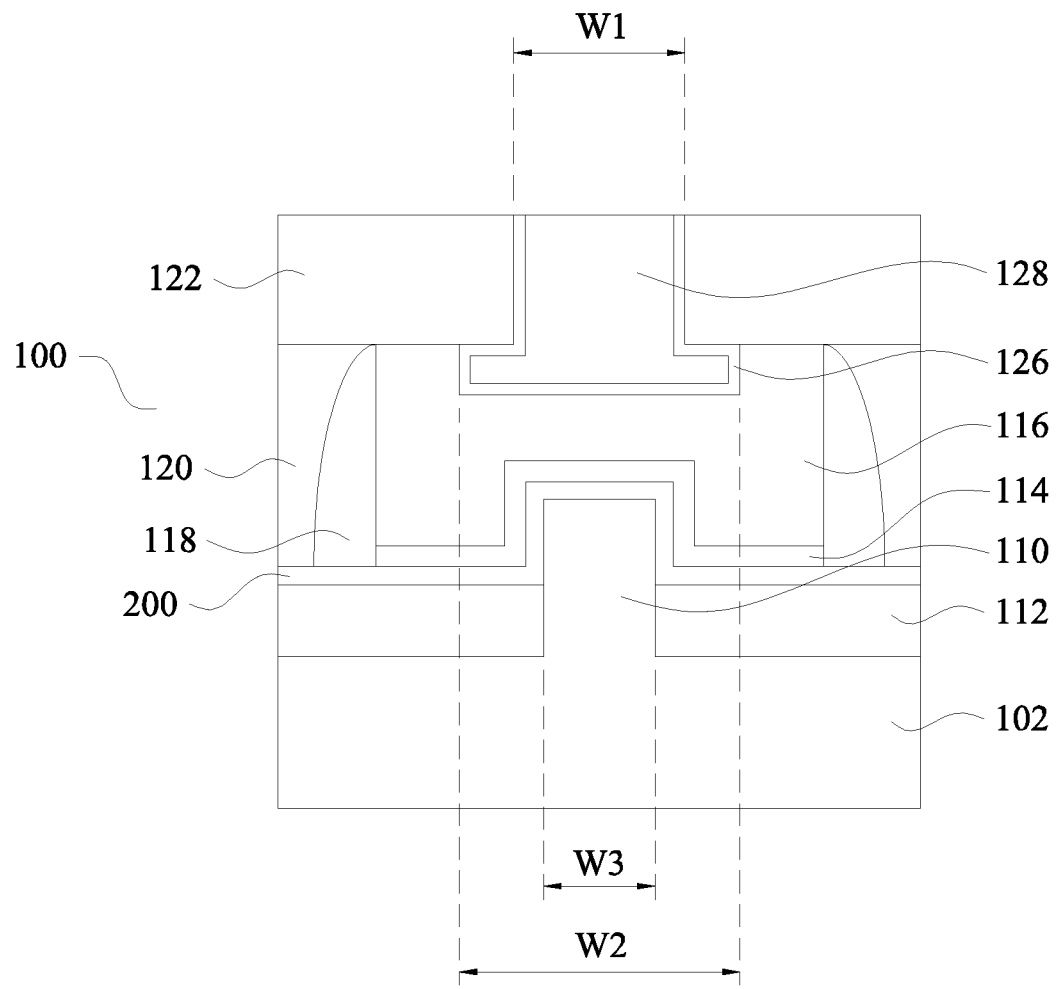
FIG. 10 illustrates a cross-sectional view of an integrated circuits (IC) structure having an interfacial layer in accordance with various embodiments.

Additionally, an interfacial layer (see e.g., element 200 of FIG. 10) may be formed under gate dielectric 114 over fin 110 and dielectric layer 112. The interfacial layer may include silicon oxide and acts as a glue/buffer layer between gate dielectric 114 and fin 110.

Figure 6:
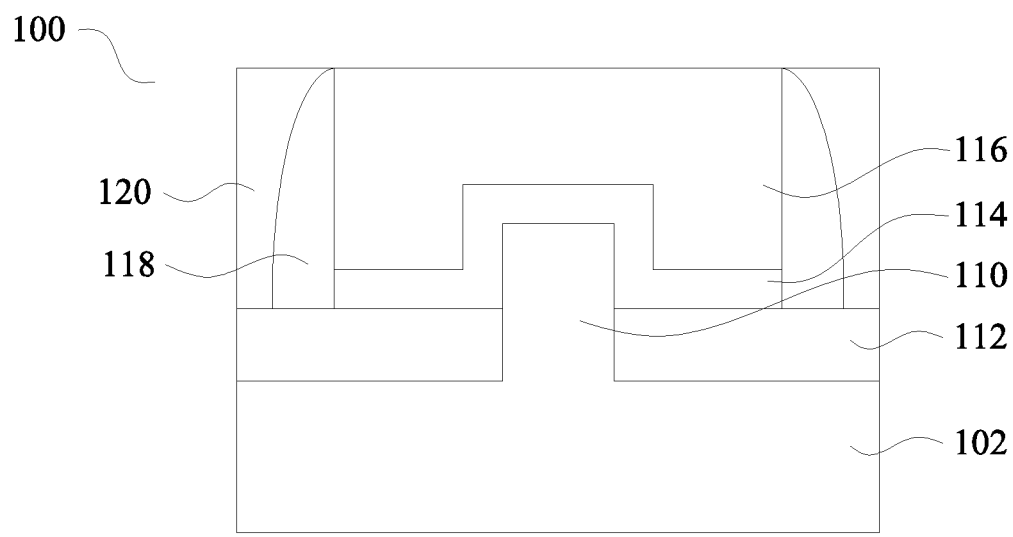

FIG. 6 illustrates the formation of gate spacers 118 and a first inter-layer dielectric (ILD) 120. Gate spacers 118 may be formed of silicon oxide, silicon nitride, and the like. Subsequently, the remaining portions of finFET 100, including source/drain regions and source/drain silicides (not shown) are formed in the lateral direction. Then, First ILD 120 may be formed of silicon oxide, phosphosilicate glass (PSG), borophosphosilicate glass (BPSG), and the like. First ILD 120 may be blanket deposited over dielectric layer 112 and gate spacer 118. The formation processes of these components are well known in the art, and are not included herein.

Figure 7:
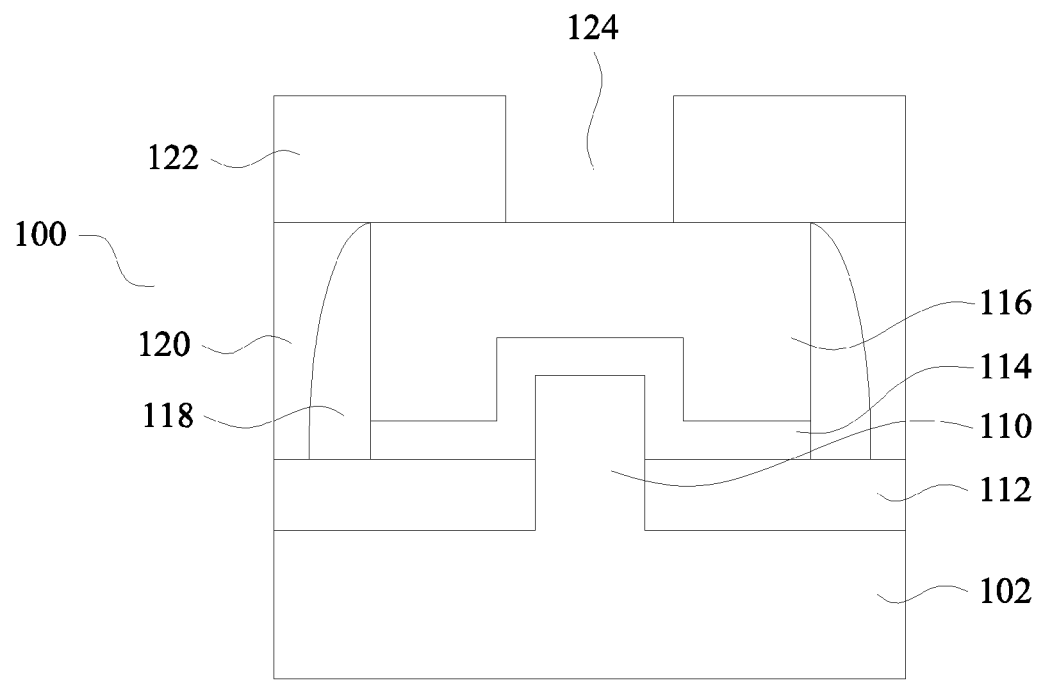

In FIG. 7, a second ILD 122 is formed over first ILD 120, gate spacers 118, and finFET 100, including gate electrode 116. Second ILD 122 may be formed of substantially the same material using substantially the same techniques as first ILD 120. Alternatively, second ILD 122 may be formed of a different material than first ILD 120. For example, first ILD 120 may be formed of PSG and second ILD 122 may be formed of silicon oxide. Second ILD 122 is patterned to form an opening 124 exposing the underlying gate electrode 116. Opening 124 may be formed using, for example, a combination of photolithographic and etching techniques.

Figure 8:
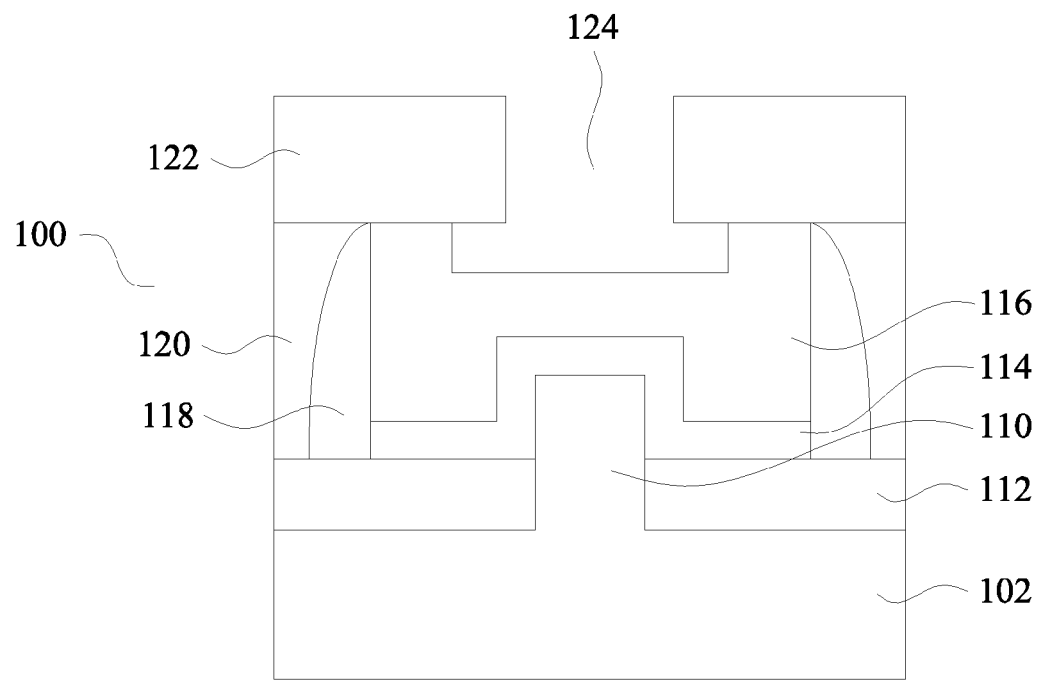

FIG. 8 illustrates the expansion of opening 124 through additional etching. The top surface of gate electrode 116 is isotropically etched to expand opening 124. The isotropic etching of gate electrode 116 may be achieved using a combination of wet and dry etching techniques without bias. For example, gate electrode 116 may be etched using a combination of wet etching with diluted hydrofluoric acid (DHF) and dry etching using a chlorine-containing gas without bias. For example, the dry etching process may be performed under a source power of about 550 W to about 850 W, and at a pressure of about 10 to 200 mTorr, using $Cl_2$, HBr and He as etching gases. Notably, the portion of opening 124 in gate electrode 116 is larger than the portion of opening 124 in second ILD 122.

Figure 9:
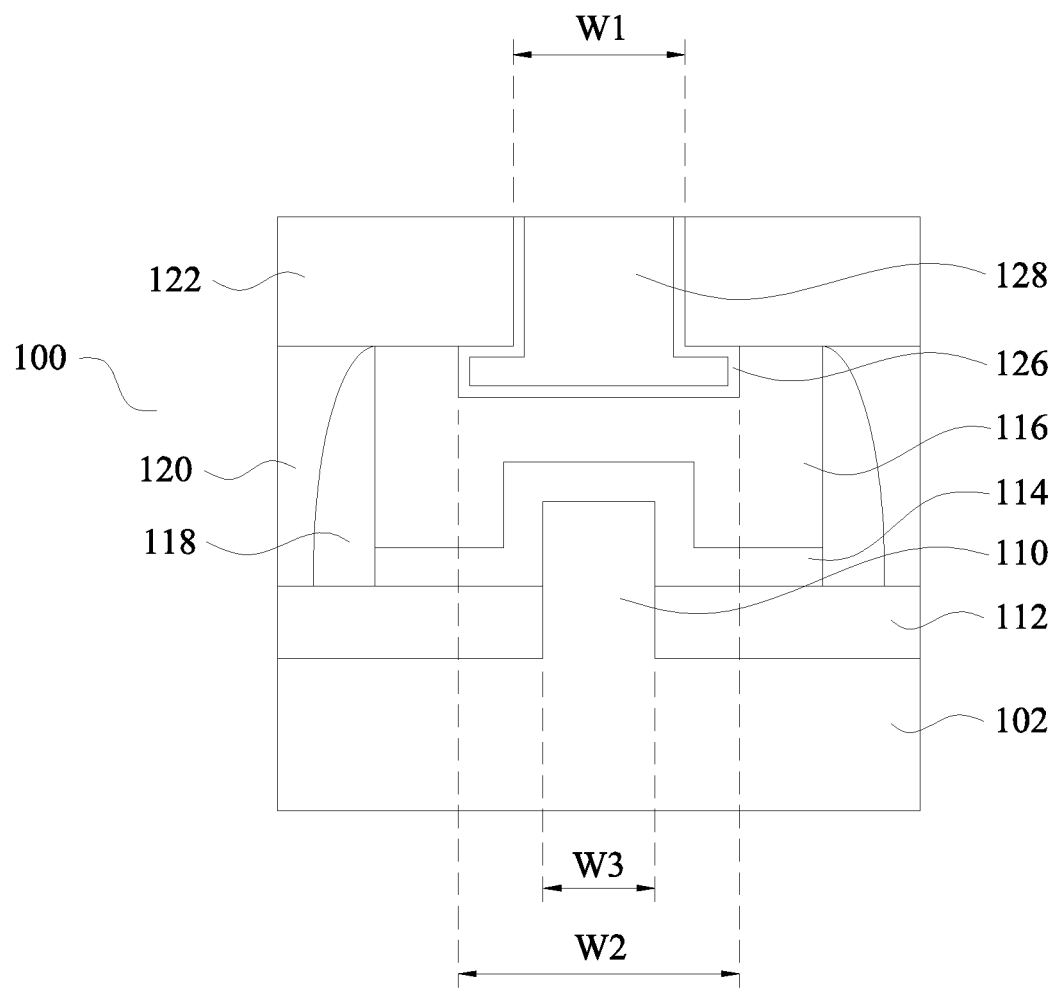

FIG. 9 illustrates the formation of contact barrier layer 126 and contact 128 in opening 124. Contact barrier layer 126 may be formed of titanium nitride, tantalum nitride, and the like. In some embodiments, contact barrier layer 126 has a thickness in the range of about 3 Å to about 20 Å. Contact barrier layer 126 covers the bottom surface and the sidewalls of opening 124. Opening 124 is then filled to create contact 128. Contact 128 may be formed of tungsten, aluminum, or copper, although other metallic materials may be used as well. Contact 128 and contact barrier layer 126 may undergo a CMP to remove excess portions of contact barrier layer 126 over second ILD 122. The CMP also results in the top surface of contact 128 being level with the top surface of ILD 122. Contact barrier layer 126 helps prevent diffusion of the metallic elements of contact 128 into second ILD 122.

In an alternative embodiment, contact barrier layer 126 may be annealed to induce metal diffusion. For example, contact barrier layer 126 may be annealed at about 250° to about 450° C., inducing the diffusion of metallic substances (e.g., aluminum) into contact barrier layer 126. The resulting contact barrier layer 126 may include titanium aluminum nitride, titanium aluminum tungsten nitride, tantalum aluminum nitride, tantalum aluminum tungsten nitride, and the like.

Contact 128 has two widths, W1 (in second ILD 122) and W2 (in gate electrode 116). In various embodiments, width W2 is wider than width W1, increasing the contact area between contact 128 and signal metal of the gate electrode 116. This increased contact area decreases the contact resistance between contact 128 and gate electrode 116. Width W1 may be limited to a particular size due to design rule limitations of different technology nodes; however, width W2 is not subject to these limitations. In various embodiments, the ratio of width W2 and width W3 of fin 110 may advantageously be between about 1.2 and 2.5. In contrast, the ratio of a typical gate contact width (e.g., W1) to width W3 is generally less than 1.2 (e.g., about 1). Thus, in the depicted embodiment, the contact area between contact 128 and gate electrode 116 is increased, reducing contact resistance, without violating any design rule limitations of different technology nodes. Although finFET 100 is shown as being a single-fin finFET (i.e., the gate is formed over a single fin), various embodiments may also be applied to a multi-fin finFET.

In accordance with an embodiment, an integrated circuit (IC) structure includes a substrate. A portion of the substrate extends upwards forming a fin. The IC structure further includes a gate dielectric over a top surface and at least portions of sidewalls of the fin, a gate electrode over the gate dielectric, and a contact over and extending into the gate electrode. The contact has a first width above the gate electrode and a second width within the gate electrode, and the first width is smaller than the second width.

In accordance with another embodiment, an integrated circuit (IC) structure includes a substrate and a semiconductor fin over and connected to the substrate. The IC structure further includes a gate dielectric over the top surface and sidewalls of the fin, a gate electrode over the gate dielectric, an inter-later dielectric (ILD) over the gate dielectric, a contact extending from a top surface of the ILD into the gate electrode, and a contact barrier layer surrounding the bottom surface and sidewalls of the contact. The contact has a first portion in the ILD and a second portion in the gate electrode, and the first and second portion have a first and second width respectively, wherein the second width is larger than the first width.

In accordance with yet another embodiment, a method for forming an integrated circuit (IC) structure includes etching a substrate to form a fin, forming a gate dielectric over the top surface and at least portions of sidewalls of the fin, forming a gate electrode over the gate dielectric, forming an interlayer dielectric (ILD) over the gate electrode, patterning the ILD to create an opening in the ILD, exposing the gate electrode, wherein the opening has a first width, and isotropically etching a portion of the gate electrode to extend the opening into the gate electrode. A portion of the opening in the gate electrode has a second width, and the second width is greater than the first width. The method further includes forming a contact barrier layer in the bottom surface and sidewalls of the opening, and filling the opening with a metallic material to form a contact.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit structure (IC) comprising:
    a substrate, wherein a portion of the substrate extends upwards forming a fin;
    a gate dielectric over a top surface and at least portions of sidewalls of the fin;
    a gate electrode over the gate dielectric; and
    a contact over and extending into the gate electrode, wherein the contact has a first width above the gate electrode and a second width within the gate electrode, the first width being smaller than the second width, wherein a top surface of the gate electrode is higher than a bottom surface of the contact, and wherein a first portion of the contact above the gate electrode and a second portion of the contact within the gate electrode are formed of a same conductive material.

2. The IC structure of claim 1, wherein a ratio of the second width to a third width of the fin is between about 1.2 and about 2.5.

3. The IC structure of claim 1, further comprising a contact barrier layer between the contact and the gate electrode, wherein the contact barrier layer further covers sidewalls of the contact.

4. The IC structure of claim 3, wherein the contact barrier layer comprises titanium nitride or tantalum nitride.

5. The IC structure of claim 3, wherein the contact barrier layer comprises titanium aluminum nitride, titanium aluminum tungsten nitride, tantalum aluminum nitride, or tantalum aluminum tungsten nitride.

6. The IC structure of claim 1, wherein the contact comprises tungsten, copper, or aluminum.

7. The IC structure of claim 1, wherein the gate dielectric comprises silicon oxide, silicon nitride, or a high-k dielectric material.

8. An integrated circuit (IC) structure comprising:
    a substrate;
    a semiconductor fin over and connected to the substrate;
    a gate dielectric over a top surface and sidewalls of the fin;
    a gate electrode over the gate dielectric;
    an inter-layer dielectric (ILD) over the gate dielectric;
    a contact extending from a top surface of the ILD into the gate electrode, wherein the contact has a first portion in the ILD and a second portion in the gate electrode, and wherein the first and second portion have a first and second width respectively, the second width being larger than the first width; and
    a continuous contact barrier layer comprising:
        a first portion disposed on a bottom surface of the contact and adjoining the gate electrode;
        a second portion disposed on an upper lateral surface of the contact and adjoining the ILD, wherein an interface between the second portion and the ILD is aligned with an interface between an upper lateral surface of the gate electrode and the ILD; and
        a third portion disposed on sidewalls of the contact and adjoining the ILD.

9. The IC structure of claim 8, wherein a ratio of the second width to a third width of the fin is between about 1.2 and about 2.5.

10. The IC structure of claim 8, wherein the contact barrier layer comprises titanium nitride or tantalum nitride.

11. The IC structure of claim 8, wherein the contact barrier layer comprises titanium aluminum nitride, titanium aluminum tungsten nitride, tantalum aluminum nitride, or tantalum aluminum tungsten nitride.

12. The IC structure of claim 8 further comprising an interfacial layer between the gate dielectric and the fin.

13. The IC structure of claim 8, further comprising a dielectric layer between the gate dielectric and the fin, wherein the dielectric layer includes a first and a second portion disposed on opposite sides of the fin.

14. The IC structure of claim 8, wherein the gate electrode comprises a signal metal and a work function metal.

15. An integrated circuit (IC) structure comprising:
    a gate comprising a gate electrode;
    an inter-layer dielectric (ILD) over the gate;
    a gate contact in the ILD and extending into the gate electrode, wherein the gate contact comprises a first width in the ILD and a second width in the gate electrode, wherein the first width is smaller than the second width, and wherein a first portion of the gate contact in the ILD and a second portion of the gate contact in the gate electrode are formed of a same conductive material; and
    a contact barrier layer disposed between gate contact and the ILD, wherein a portion wherein a top surface of the contact barrier layer is substantially level with a top surface of the gate electrode.

16. The IC structure of claim 15, further comprising a substrate comprising a portion extending upwards forming a fin, wherein the gate is disposed over the substrate and extends along sidewalls of the fin.

17. The IC structure of claim 16, wherein a ratio of the second width to a third width of the fin is between about 1.2 and about 2.5.

18. The IC structure of claim 15 further comprising a gate dielectric disposed under the gate electrode.

19. The IC structure of claim 15, wherein the contact barrier layer is disposed on sidewalls, a top surface, and a bottom surface of the gate contact.

20. The IC structure of claim 15, wherein the contact barrier layer comprises titanium nitride, tantalum nitride, titanium aluminum nitride, titanium aluminum tungsten nitride, tantalum aluminum nitride, or tantalum aluminum tungsten nitride.

* * * * *